(12) United States Patent
Tu

(10) Patent No.: US 8,823,043 B2
(45) Date of Patent: *Sep. 2, 2014

(54) FLIP-CHIP LIGHT EMITTING DIODE

(71) Applicant: RGB Consulting Co., Ltd., Tainan (TW)

(72) Inventor: Chuan-Cheng Tu, Taipei (TW)

(73) Assignee: RGB Consulting Co., Ltd., Tainan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/662,326

(22) Filed: Oct. 26, 2012

(65) Prior Publication Data

US 2013/0105844 A1    May 2, 2013

(30) Foreign Application Priority Data

Oct. 28, 2011   (TW) .............................. 100220330 U

(51) Int. Cl.
*H01L 33/00* (2010.01)
*H01L 33/38* (2010.01)

(52) U.S. Cl.
CPC .......... *H01L 33/0079* (2013.01); *H01L 33/382* (2013.01); *H01L 33/387* (2013.01)
USPC ................... 257/99; 257/76; 257/79; 257/13; 257/93; 257/98; 257/81; 438/706

(58) Field of Classification Search
CPC ..... H01L 33/52; H01L 33/62; H01L 33/0079; H01L 33/24; H01L 33/28; H01L 33/382; H01L 33/385; H01L 33/387; H01L 33/405
USPC ......... 257/99, 76, 79, 13, 93, 98, 81; 438/706
See application file for complete search history.

(56) References Cited

U.S. PATENT DOCUMENTS

| | | | |
|---|---|---|---|
| 6,914,268 B2 * | 7/2005 | Shei et al. ........................ | 257/99 |
| 7,033,949 B2 * | 4/2006 | Lan et al. ....................... | 438/706 |
| 7,683,381 B2 * | 3/2010 | Hsu et al. ......................... | 257/81 |
| 8,017,963 B2 * | 9/2011 | Donofrio et al. ................ | 257/98 |
| 8,395,176 B2 * | 3/2013 | Seong et al. ..................... | 257/99 |
| 8,530,921 B2 * | 9/2013 | Ibbetson et al. ................ | 257/98 |
| 2003/0146438 A1 * | 8/2003 | Tu et al. .......................... | 257/79 |
| 2005/0104080 A1 * | 5/2005 | Ichihara et al. ................. | 257/98 |
| 2009/0001402 A1 * | 1/2009 | Sakai .............................. | 257/99 |
| 2009/0250685 A1 * | 10/2009 | Moon ............................. | 257/13 |
| 2011/0156088 A1 * | 6/2011 | Moon et al. ..................... | 257/99 |
| 2012/0181546 A1 * | 7/2012 | Tu ................................... | 257/76 |
| 2012/0241760 A1 * | 9/2012 | Okabe ............................. | 257/76 |
| 2014/0070245 A1 * | 3/2014 | Haberern et al. ............... | 257/93 |

* cited by examiner

*Primary Examiner* — Fernando L Toledo
*Assistant Examiner* — Mohammed Shamsuzzaman
(74) *Attorney, Agent, or Firm* — Muncy, Geissler, Olds & Lowe, P.C.

(57) ABSTRACT

A flip-chip light emitting diode comprises a transparent base-plate, at least a first electrical semi-conductive layer, a light emitting layer, a second electrical semi-conductive layer, at least a first ohmic contact, a second ohmic contact and a third ohmic contact are installed above the transparent base-plate. The at least first ohmic contact is electrically connected to the third ohmic contact through a connection passage. A first electrode area is formed above the second electrical semi-conductive layer. The second ohmic contact is disposed above the transparent base-plate and adjacent to a side of the first ohmic contact. A second electrode area is formed on the second ohmic contact.

10 Claims, 4 Drawing Sheets

FLIP-CHIP LIGHT EMITTING DIODE

BACKGROUND OF THE INVENTION

1. Field of Invention

The present invention relates to a flip-chip light emitting diode with high illumination intensity and high power by which the operational voltage of the light emitting diode can be reduced, the lumen/watt can be enhanced and the high light emitting efficiency can be maintained effectively.

2. Related Art

In the recent years, light emitting diode with high illumination intensity made of nitrides and phosphides have been developed which not only can emit red, blue and green light, but also various colors of light and white light.

Conventional light emitting diode is directly made as a light emitting diode epitaxial structure disposing on a substrate material. Cathode electrode and anode electrode are made on the side of the light emitting diode epitaxial structure and the side of the substrate material respectively. Even though such structure has better electric current distribution effect, it is difficult to reduce the operational temperature of the light emitting diode because the light emitting layer is disposed relatively far away from the package base and the impedance of heat conduction is relatively high. Therefore, it becomes an obstacle to develop light emitting diode with higher power. Consequently, flip-chip light emitting diode has been developed in the recent years.

In a flip-chip light emitting diode, a p-type semi-conductive layer and a n-type semi-conductive layer of the light emitting diode epitaxial structure are exposed on the same side of the light emitting diode epitaxial structure, so that a cathode electrode and an anode electrode can be made on the same side of the light emitting diode epitaxial structure. Therefore, flip-chip packaging can be employed to directly stack the light emitting diodes installed with the cathode electrode and the anode electrode on a package solder. Thereby, conventional metal wire bonding is not required and the package area can be reduced effectively. At the same time, the thermal resistance of the light emitting diode can be reduced because the light emitting layer is closer to the package base. As a result, the reliability of the light emitting diode can be enhanced substantially.

Even though flip-chip light emitting diode can provide some advantages in packaging, because the p-type semi-conductive layer and the n-type semi-conductive layer of the light emitting diode epitaxial structure are exposed on the same side of the light emitting diode epitaxial structure, and the electric conductivity of the semi-conductive layer is relatively poor; electric current can not be evenly distributed from the connecting points effectively and the density of electric current of some areas inside the light emitting diode is too high. As a result, the overall illumination intensity and the life expectancy are reduced and the light emitting efficiency of the light emitting diode is affected.

SUMMARY OF THE INVENTION

A primary objective of the present invention is to provide a flip-chip light emitting diode with high illumination intensity and high power by which the operational voltage of the light emitting diode can be reduced, the lumen/watt can be enhanced and the high light emitting efficiency can be maintained effectively.

In order to achieve the above-mentioned objective, a flip-chip light emitting diode of the present invention comprises a transparent base-plate, at least a first electrical semi-conductive layer, a light emitting layer, a second electrical semi-conductive layer, at least a first ohmic contact, a second ohmic contact and a third ohmic contact are installed above the transparent base-plate. The at least first ohmic contact is electrically connected to the third ohmic contact through a connection passage. A first electrode area is formed above the second electrical semi-conductive layer. The second ohmic contact is disposed above the transparent base-plate and adjacent to a side of the first ohmic contact. A second electrode area is formed on the second ohmic contact.

The present invention will become more fully understood by reference to the following detailed description thereof when read in conjunction with the attached drawings.

DETAILED DESCRIPTION OF THE INVENTION

Figure 1:
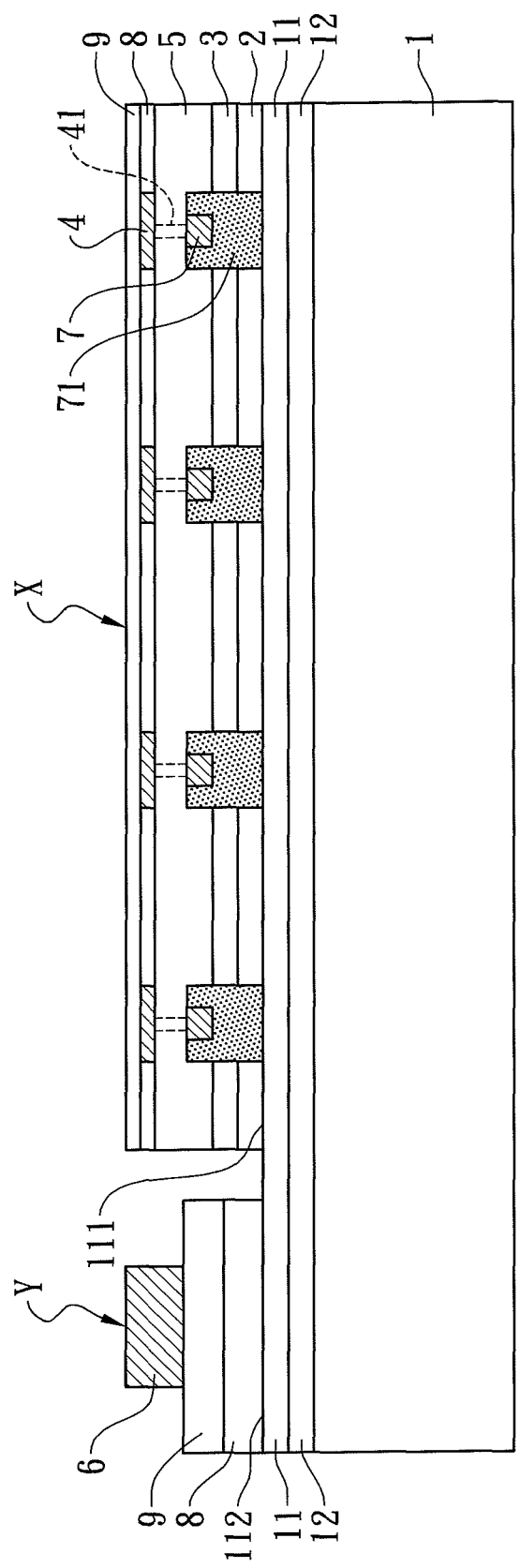
FIG. 1 is a cross-sectional view of a light emitting diode according to an embodiment of the present invention.

Please refer to FIG. 1. FIG. 1 is a cross-sectional view of a flip-chip light emitting diode according to a first embodiment of the present invention. The flip-chip light emitting diode is composed of a transparent base-plate 1, a first electrical semi-conductive layer 2, a light emitting layer 3, a plurality of first ohmic contacts 4, a second electrical semi-conductive layer 5 and a second ohmic contact 6.

The transparent base-plate 1 can be sapphire, glass substrate, gallium arsenide, gallium phosphide, gallium nitride or silicon carbide. The first electrical semi-conductive layer 2 is formed above the transparent base-plate 1. A transparent conductive layer 11 is further disposed between the first electrical semi-conductive layer 2 and the transparent base-plate 1. The transparent conductive layer 11 can be indium tin oxide (ITO), zinc oxide (ZnO) or the combination of ITO and ZnO. A transparent adhesive layer 12 is further disposed between the transparent conductive layer 11 and the transparent base-plate 1. The transparent adhesive layer 12 is made of thermosetting benzocyclobutene (BCB) resin, polyimide (PI), perfluorocyclobutane (PFCB), indium tin oxide (ITO) or the combination of them.

A first surface 111 and a second surface 112 are formed on the transparent conductive layer 11. The first electrical semi-conductive layer 2 is disposed on the first surface 111 on the transparent conductive layer 11 and the transparent conductive layer 11 is disposed above the transparent base-plate 1. The light emitting layer 3 is formed on the first electrical semi-conductive layer 2. The light emitting layer 3 is made from at least a compound of aluminum gallium indium nitride (AlGaInN), aluminium gallium indium phosphide (AlGaInP), gallium arsenide (GaAs), indium gallium arsenide (InGaAs), indium phosphide (InP) and aluminum gallium arsenide (AlGaAs).

The second electrical semi-conductive layer 5 is formed on the light emitting layer 3. The first ohmic contacts 4 are formed on some area of the second electrical semi-conductive layer 5. At least a third ohmic contact 7 is further disposed below the second electrical semi-conductive layer 5. The total area of the first ohmic contacts 4 on the second electrical semi-conductive layer 5 can be larger than that of the third ohmic contacts 7 below the second electrical semi-conductive layer 5. At least a connection passage 41 is disposed between one of the first ohmic contacts 4 and one of the third ohmic contacts 7 so that all the first ohmic contacts 4 are electrically connected to all the third ohmic contacts 7. The third ohmic contacts 7 below the second electrical semi-conductive layer 5 are covered by an insulation layer 71 in order that the third ohmic contacts 7 are separated from the first electrical semi-conductive layer 2. Furthermore, a reflective layer 8 is also on the second electrical semi-conductive layer 5. A barrier layer 9 is coupled on the reflective layer 8. The barrier layer 9 comprises nickel (Ni), tungsten (W), tungsten nitride (WN), titanium nitride (TiN) and platinum (Pt). The reflective layer 8 at least comprises silver (Ag), aluminum (Al), gold (Au), rhodium (Rh), nickel (Ni) and their alloys. A first electrode area X is formed on the barrier layer 9 above the first ohmic contacts 4.

The second ohmic contact 6 is formed above the second surface 112 on the transparent conductive layer 11 and the transparent conductive layer 11 is disposed above the transparent base-plate 1. The second ohmic contact 6 is disposed adjacent to the first ohmic contacts 4. A second electrode area Y is formed on the second ohmic contact 6. The reflective layer 8 can be disposed between the second ohmic contact 6 and the transparent conductive layer 11. The barrier layer 9 can be disposed between the second ohmic contact 6 and the reflective layer 8. The barrier layer 9 comprises nickel (Ni), tungsten (W), tungsten nitride (WN), titanium nitride (TiN) and platinum (Pt). The reflective layer 8 at least comprises silver (Ag), aluminum (Al), gold (Au), rhodium (Rh), nickel (Ni) and their alloys.

The first electrical semi-conductive layer 2 can be p-type and the second electrical semi-conductive layer 5 can be n-type; or, the first electrical semi-conductive layer 2 can be n-type and the second electrical semi-conductive layer 5 can be p-type. Because n-type semi-conductor has better conductivity, less quantity of metal electrodes can be used in order to reduce absorption and enhance illumination intensity. Therefore, in this embodiment, the first electrical semi-conductive layer 2 is preferably p-type and the second electrical semi-conductive layer 5 is preferably n-type.

Furthermore, an upper surface of the second electrical semi-conductive layer 5 is a surface with a pattern in favor of forming a surface plasmon in order to enhance the light emitting efficiency. An outer surface of the transparent base-plate 1 can be made rough and uneven in order that the probability of light outputting outwardly can be increased, the light extraction efficiency of the light emitting diode and the overall light outputting intensity can be enhanced. A surface of the first electrical semi-conductive layer 2 in contact with the transparent base-plate 1 can be made rough and uneven in order to improve the optical phenomenon of total internal reflection of the light emitting diode and to effectively enhance the light outputting intensity of the light emitting diode.

Thereby, when the first ohmic contacts 4 on the second electrical semi-conductive layer 5 are electrically connected to the third ohmic contacts 7 through the connection passages 41, the ohmic conductive area is increased substantially and the operational voltage of the light emitting diode can be reduced substantially. Therefore, the ohmic loss of the light emitting diode is reduced and the light emitting efficiency (lumen/watt) of the light emitting diode is enhanced. Furthermore, the operational temperature of the light emitting diode is reduced and therefore the light emitting diode can operate at even higher power and the cost (rate/lumen) for the light emitting element can be reduced.

Figure 2:
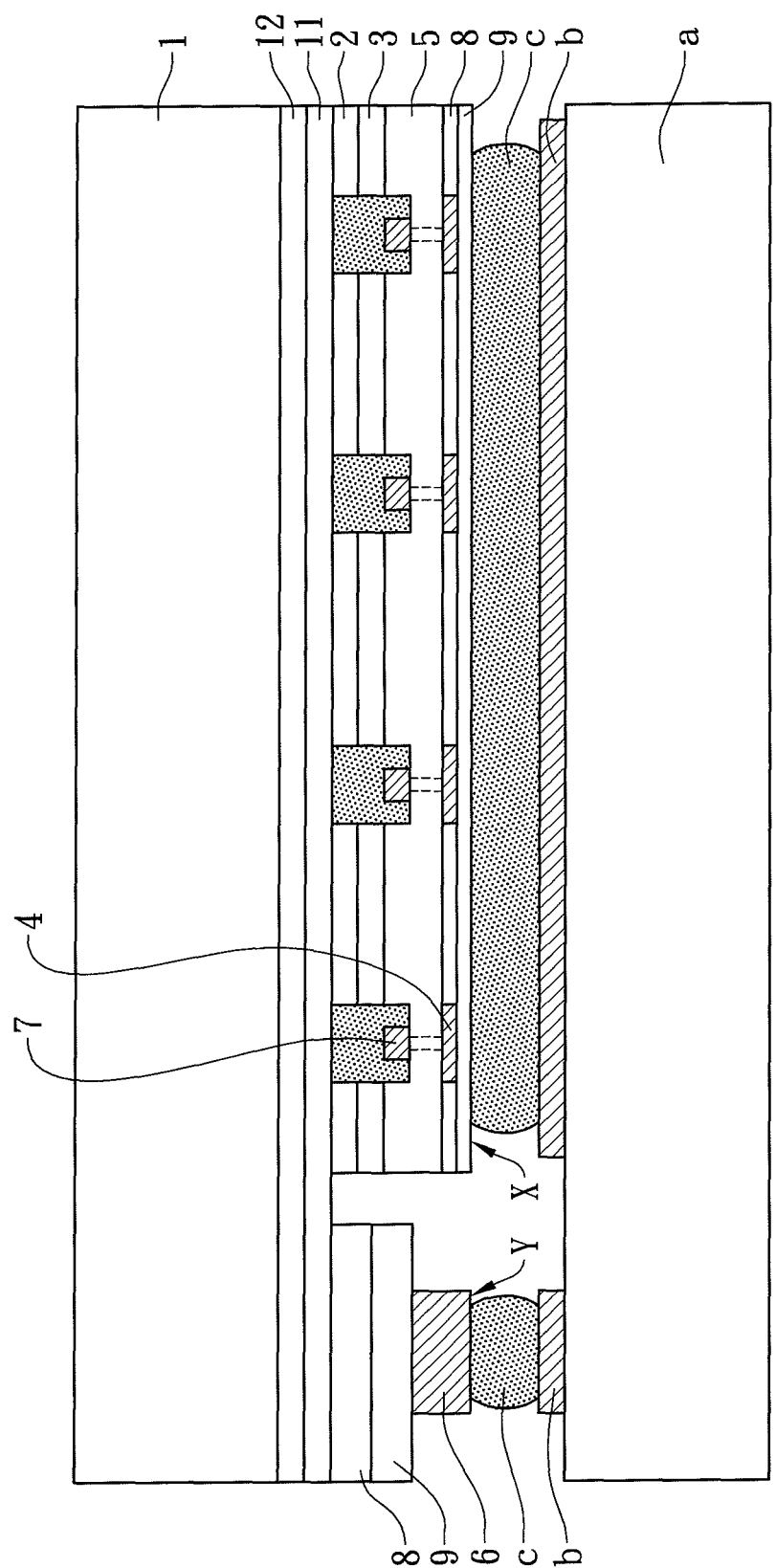
FIG. 2 is a cross-sectional view of the light emitting diode connected above a package base according to the embodiment of the present invention.

As shown in FIG. 2, after the above structure is formed, the structure is placed upside down to connect above a package base a by flip-chip technology. The package base a can be a base-plate with a high thermal conductivity coefficient such as an n-type silicon base-plate or a p-type silicon base-plate. The package base a can also be a ceramic base-plate. At least two conductive traces b are disposed on the package base a in corresponding to the first electrode area X above the first ohmic contacts 4 and the second electrode area Y on the second ohmic contact 6 respectively. The above structure is connected above the package base a by a medium layer c composed of a soldering material to form a flip-chip light emitting diode. The heat produced by the flip-chip light emitting diode can be transferred externally from the elements speedily through the package base a. Therefore, the flip-chip light emitting diode is suitable for using in high power light emitting diode. The medium layer c is made of base metals, metal alloys, semi-conductor alloys, adhesive materials with heat conductivity and electric conductivity or LED crystalline grains, and different metal fusion points, gold bumps or soldering bumps between the package base a.

Figure 3:
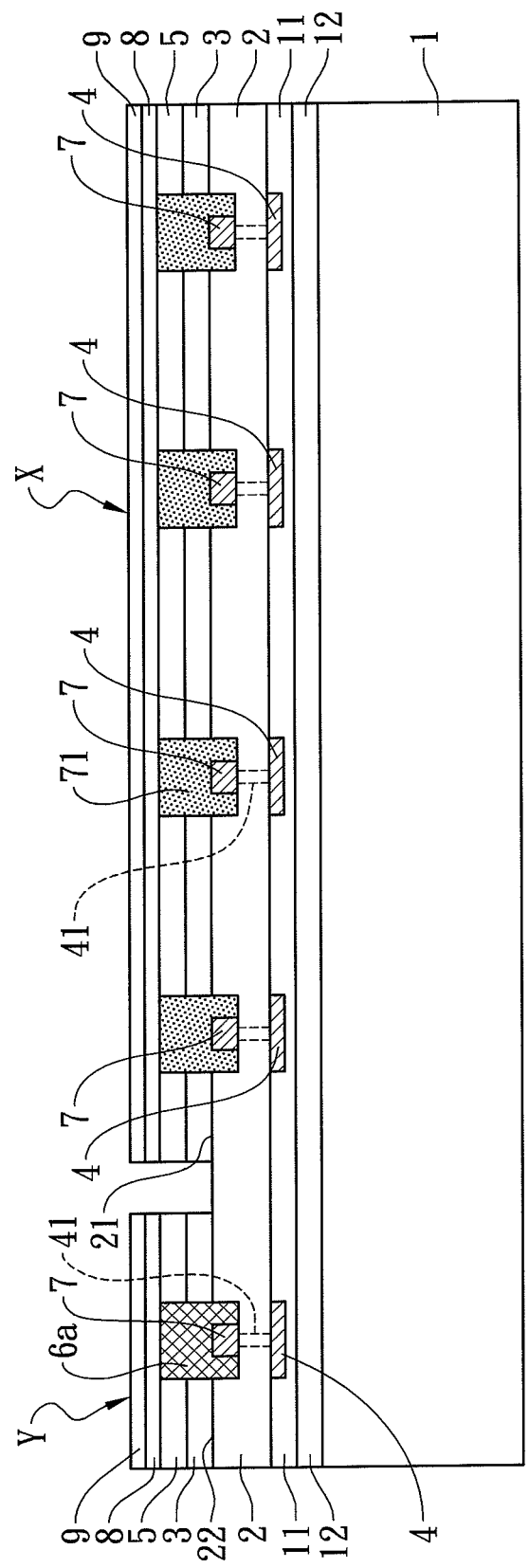
FIG. 3 is a cross-sectional view of the light emitting diode according to another embodiment of the present invention.

Please refer to FIG. 3. FIG. 3 is a cross-sectional view of a flip-chip light emitting diode according to a second embodiment of the present invention. The flip-chip light emitting diode is composed of the transparent base-plate 1, the first electrical semi-conductive layer 2, the light emitting layer 3, the second electrical semi-conductive layer 5, the plurality of first ohmic contacts 4 and a metal connection layer 6a. (The related materials are the same as those of the first embodiment and therefore will not be described again.)

The first electrical semi-conductive layer 2 is formed above the transparent base-plate 1. A transparent conductive layer 11 is disposed between the first electrical semi-conductive layer 2 and the transparent base-plate 1. A transparent adhesive layer 12 is disposed between the transparent conductive layer 11 and the transparent base-plate 1.

A first surface 21 and a second surface 22 are adjacently disposed on the first electrical semi-conductive layer 2. The light emitting layer 3 is formed on the first surface 21 of the first electrical semi-conductive layer 2. The second electrical semi-conductive layer 5 is formed on the light emitting layer 3. The reflective layer 8 is disposed on the second electrical semi-conductive layer 5, and the barrier layer 9 is disposed on the reflective layer 8. The first electrode area X is formed on the barrier layer 9 above the second electrical semi-conductive layer 5.

At least more than one of the first ohmic contacts 4 is formed on a lower surface of the first electrical semi-conductive layer 2 below the first surface 21 and the second surface 22. At least more than one of the third ohmic contacts 7 are further disposed on the first electrical semi-conductive layer 2. At least one of the connection passages 41 is disposed between one of the first ohmic contacts 4 and one of the third ohmic contacts 7 in order that all the first ohmic contacts 4 are electrically connected to all the third ohmic contacts 7. The reflective layer 8 and the barrier layer 9 are sequentially disposed above the third ohmic contacts 7 on the second surface 22. The second electrode area Y is formed on the barrier layer 9. Furthermore, the metal connection layer 6a is disposed between the third ohmic contacts 7 and the reflective layer 8 above the second surface 22.

The third ohmic contacts 7 on the first surface 21 are covered by the insulation layer 71 in order that the third ohmic contacts 7 are separated from the second electrical semi-conductive layer 5.

The first ohmic contacts 4 are electrically conducted with each other through the transparent conductive layer 11 and thereby electrically connected to the third ohmic contacts 7 through the connection passages 41. The ohmic conductive area is increased substantially and the operational voltage of the light emitting diode can be reduced substantially. Therefore, the ohmic loss of the light emitting diode is reduced and the light emitting efficiency (lumen/watt) of the light emitting diode is enhanced. Furthermore, the operational temperature of the light emitting diode is reduced and therefore the light emitting diode can operate at even higher power and the cost (rate/lumen) for the light emitting element can be reduced.

Figure 4:
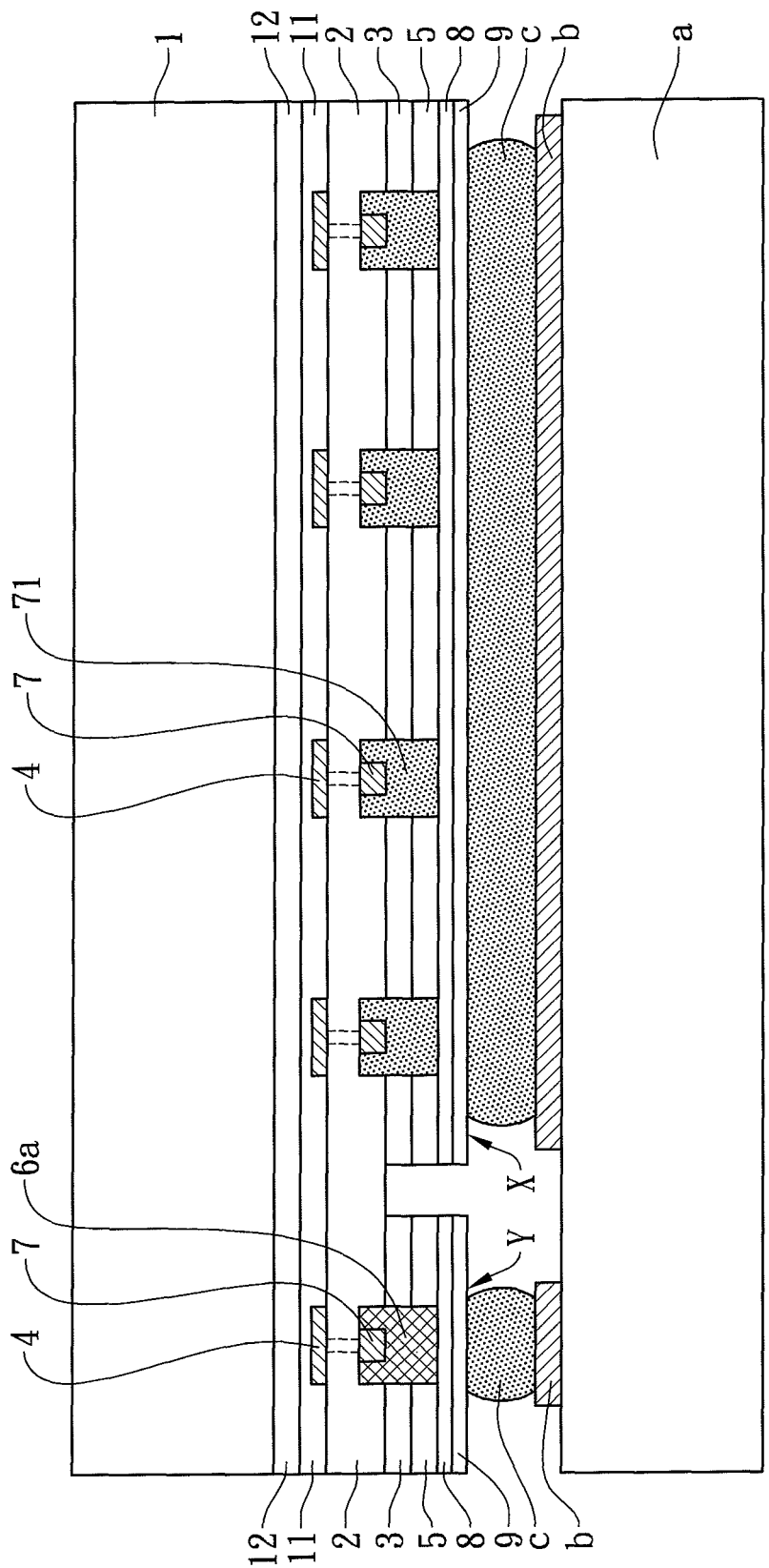
FIG. 4 is a cross-sectional view of the light emitting diode connected above the package base according to another embodiment of the present invention.

As shown in FIG. 4, after the above structure is formed, the structure is placed upside down to connect above the package base a by flip-chip technology. The two conductive traces b of the package base a correspond to the first electrode area X and the second electrode area Y respectively. The above structure is connected above the package base a by the medium layer c composed of a soldering material to form a flip-chip light emitting diode. The heat produced by the flip-chip light emitting diode can be transferred externally from the elements speedily through the package base a. Therefore, the flip-chip light emitting diode is suitable for using in high power light emitting diode.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A flip-chip light emitting diode, comprising:
   a transparent base-plate;
   a first electrical semi-conductive layer formed on the transparent base-plate;
   a light emitting layer formed on the first electrical semi-conductive layer;
   a second electrical semi-conductive layer formed on the light emitting layer;
   at least a first ohmic contact formed above the second electrical semi-conductive layer, at least a third ohmic contact being installed below the second electrical semi-conductive layer, at least a connection passage being disposed between the first ohmic contact and the third ohmic contact to electrically connect the first ohmic contact to the third ohmic contact, a first electrode area being formed above the first ohmic contact; and
   a second ohmic contact formed above the transparent base-plate and adjacent to the first ohmic contact, a second electrode area being formed on the second ohmic contact;
   wherein the third ohmic contact below the second electrical semi-conductive layer is covered by an insulation layer in order that the third ohmic contact is separated from the first electrical semi-conductive layer.

2. The flip-chip light emitting diode as claimed in claim 1, wherein a transparent adhesive layer is further disposed on the transparent base-plate.

3. The flip-chip light emitting diode as claimed in claim 2, wherein a transparent conductive layer is further disposed on the transparent adhesive layer.

4. The flip-chip light emitting diode as claimed in claim 1, wherein the transparent base-plate can conduct electricity.

5. The flip-chip light emitting diode as claimed in claim 1, wherein the total area of the first ohmic contact on the second electrical semi-conductive layer is larger than that of the third ohmic contact below the second electrical semi-conductive layer.

6. The flip-chip light emitting diode as claimed in claim 1, wherein the first electrical semi-conductive layer is p-type and the second electrical semi-conductive layer is n-type.

7. The flip-chip light emitting diode as claimed in claim 1, wherein the first electrical semi-conductive layer is n-type and the second electrical semi-conductive layer is p-type.

8. The flip-chip light emitting diode as claimed in claim 1, wherein the transparent base-plate has a rough and uneven outer surface.

9. The flip-chip light emitting diode as claimed in claim 1, wherein a surface of the first electrical semi-conductive layer in contact with the transparent base-plate is a rough and uneven surface.

10. The flip-chip light emitting diode as claimed in claim 1, wherein an upper surface of the second electrical semi-conductive layer is a surface with a pattern in favor of forming a surface plasmon.

* * * * *